United States Patent [19]

Ballard

[11] Patent Number: 5,107,377
[45] Date of Patent: Apr. 21, 1992

[54] METHOD AND APPARATUS FOR DIGITAL STORAGE AND RETRIEVAL OF DATA

[75] Inventor: Clinton Ballard, Saratoga, Calif.

[73] Assignee: Ballard Synergy Corporation, Port Orchard, Wash.

[21] Appl. No.: 335,254

[22] Filed: Apr. 10, 1989

[51] Int. Cl.$^5$ .............................. G11B 20/02
[52] U.S. Cl. .......................... 360/40; 360/44
[58] Field of Search ................ 360/40, 44, 45

[56] References Cited

U.S. PATENT DOCUMENTS

| | | | |
|---|---|---|---|
| 4,286,294 | 8/1981 | Nakauchi et al. | 360/27 |
| 4,302,783 | 11/1981 | Mima et al. | 360/47 |
| 4,353,099 | 10/1982 | Shum et al. | 360/27 |
| 4,385,327 | 5/1983 | Pate | 360/27 |
| 4,425,589 | 1/1984 | Camras | 360/51 |
| 4,516,162 | 5/1985 | West | 360/25 |
| 4,535,368 | 8/1985 | Schwartz et al. | 360/28 |
| 4,544,961 | 10/1985 | Chi | 360/44 |
| 4,609,949 | 9/1986 | Kataragi | 360/28 |
| 4,635,141 | 1/1987 | Coulte | 360/44 |
| 4,682,246 | 7/1987 | Efron et al. | 360/25 X |

FOREIGN PATENT DOCUMENTS 0164009  9/1983  Japan ..................... 360/40

Primary Examiner—David J. Severin
Attorney, Agent, or Firm—Townsend and Townsend

[57] ABSTRACT

A method and apparatus for error detection and correction in the storage and retrieval of digital data on magnetic storage systems includes converting the digital data into analog waveforms, multiplexing the analog waveforms with reference values and storing same as a data stream, demultiplexing the reference values from the data stream and using the retrieved reference values to detect and reduce distortion or other errors in the data stream. Assignment of data to analog waveforms includes option of assigning arbitrary quantities of data to a compact analog waveform representation. Analog errors may be detected and corrected statistically, while digital errors may be detected and corrected using standard signal processing techniques.

17 Claims, 3 Drawing Sheets

METHOD AND APPARATUS FOR DIGITAL STORAGE AND RETRIEVAL OF DATA

BACKGROUND OF THE INVENTION

1. Field of the Invention

The present invention relates generally to the field of data storage and retrieval, and more particularly to the use of reference value comparisons and digital signal processing techniques to detect and correct data storage errors.

2. Brief Description of the Prior Art

Commonly known digital storage and retrieval devices for magnetic media operate based on two state changes in the analog magnetic flux continuum. That is, digital data consisting of a series of ones and zeros are represented on the magnetic media by magnetic flux transitions. Storage of digital data is accomplished by modulating the local field of a so-called "write head" as a function of data changes from one to zero or zero to one, and positioning media in appropriate proximity to the write head such that the field changes are recorded on the media. Retrieval of the digital data involves detecting the flux changes stored on media and translating those changes into the appropriate series of ones and zeros. The relatively high noise inherent in pure analog storage and retrieval techniques (i.e., storing and retrieving data in the form of local relative values as opposed to mere flux transitions) have heretofore proved an insurmountable barrier to their effective use.

While it is true that digital methods involve certain amounts of noise and various sources of error, many digital error correction schemes exist. A great number of these schemes utilize the fact that digital data can only validly assume two values, typically zero and one. Analog outputs are, therefore, not amenable to such error correction schemes. Thus, pure analog systems (i.e., those with analog outputs) are generally limited to applications where relatively high error rates are acceptable. Use of a digital-to-analog (d/a) converter to store data, and an analog-to-digital (a/d) converter to retrieve data has been utilized. Employment of digital data error correction techniques may then be made at certain stages of storage and retrieval. However, such arrangements result in severe noise effects from the various circuitry, conversion processes and media utilized as well documented in the prior art. This noise, especially in its analog form, cannot be adequately corrected for or filtered. Certain other hybrid approaches have been utilized in the prior art employing various correction techniques, but none have fully accounted for the varieties of errors implicit in each.

The type of errors resulting from prior art arrangements can be categorized as one of two types: (a) permanent, or (b) transient. Permanent errors are typically due to some physical characteristic of an element of the system, and are called such since they are consistent within a single system. For example, the media may have imperfections due to manufacturing processes, age, etc. Also, the frequency of signal storage may vary due to varying geometries such as that encountered when moving from one track to the next on a disk. Transient errors can be caused by the transport mechanism, such as rotational distortion resulting in wow and flutter. The circuitry itself can also be the source of transient errors, such as magnetic head charged storage, system instabilities, etc. External effects such as heat, vibration, radiation or unstable power supply can also cause transient noise. These effects result in random bit errors or a burst of bit errors and are called transient errors since they may vary within a single system (e.g., one system may introduce a bit error in one physical location on one medium yet not produce that error on a second medium).

Many error correction techniques exist, varying in complexity from a simple least-square-errors fit to a complex Reed/Solomon code. Physical differences such as varying track sizes are typically handled by precompensating the signals to accommodate for the varying geometries. Wow and flutter are typically reduced by modulating a high frequency carrier signal or introducing a reference signal and wholesale compensating the stored data as a function of detected error in storage and retrieval of the reference signal.

Prior to the present invention, there has been no method presented which takes advantage of the information imbedded in the many levels of the flux continuum, while simultaneously obtaining high bandwidth with relatively low error rates. That is, no prior art method or apparatus has been heretofore disclosed which is capable of utilizing essentially an analog spectrum with digital data accuracy.

SUMMARY OF THE INVENTION

The present invention overcomes the disadvantages and shortcomings of the prior art by providing a data storage and retrieval system using the analog data spectrum for data representation, but which is fully susceptible to digital signal processing techniques for noise detection and correction. Furthermore, the present invention allows storage of arbitrary amounts of data as appropriate in particular applications.

The present invention involves forming a set of waveforms, referred to as reference waveforms. The reference waveforms may be a standard set or may be unique to a particular application. In any event, each reference waveform may have associated with it an identifier. That identifier will be unique to a particular reference waveform. That identifier will, in turn, be associated with an N-array number or set of numbers. In this way, each reference waveform used will represent some number or set of numbers.

When storing data, an arbitrary digital data stream is converted into a corresponding stream of identifiers. A reference waveform associated with each identifier is retrieved from storage or otherwise generated in the appropriate order, and stored on the magnetic medium as the data waveform stream. Also stored on the medium in a preselected order, together with the data waveform stream, is each reference waveform used. A marker or indicator may also be employed to indicate the number and location of the reference waveforms used. If, for example, a magnetic disk is the storage medium used, each track will include a data waveform stream, a set of reference waveforms and optionally a marker or indicator.

When retrieving data, the reference waveforms are retrieved first, and assigned identifiers based on their order or position. Then, the data waveform stream is retrieved in individual waveforms (or appropriately partitioned from the continuous stream) and each waveform is compared (e.g., statistically) with the retrieved reference waveform. When a match is determined, the data waveform is assigned the appropriate identifier. These values may then be converted into the appropriate digital data stream. Post-conversion processing such as error detection, control or other operation may then be performed on or by the digital data.

DETAILED DESCRIPTION OF SELECTED EMBODIMENTS

1. General Embodiments

Figure 1:
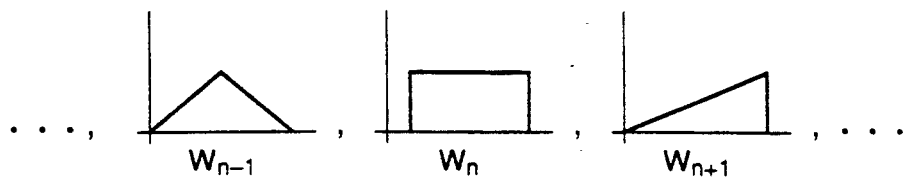
FIG. 1 shows an arbitrary partial sample reference waveform set in graphical form as utilized by one embodiment of the present invention.

An underlying element of each embodiment of the present invention is the reference waveform set. The reference waveform set may be unique to an embodiment or may be common among several embodiments. Resolution of the storage and retrieval equipment and storage media will, in part, determine the nature of the reference waveform set. The variety and nature of the data to be stored will also play a role in determining the nature of the reference waveform set as well as its size. For example, a data set consisting of N unique data points will require an N-element reference waveform set, while the storage and retrieval elements must be capable of distinguishing the particular elements of the N-element reference waveform set. FIG. 1 shows an arbitrary partial sample reference waveform set in graphical form, consisting of reference waveforms $\{\ldots, w_{n-1}, w_n, w_{n+1}, \ldots\}$.

The reference waveform set may be generated dynamically by external apparatus or may be predetermined and stored in appropriate device memory. The reference waveforms may be stored in a variety of ways ranging from being explicitly stored in digital memory as a set of points to being embodied in a set of reference circuits which produce the individual reference waveforms. It is also possible that the system may utilize a hybrid approach for storing the reference waveforms other than that described. The important criterion is the ability to be able to construct a continuous analog signal by combining the different reference waveforms in an arbitrary sequence. Thus, each waveform in the reference waveform set must share a common beginning and ending value.

Each reference waveform in the reference waveform set is preferably assigned a unique identifier. This also may be done dynamically, for example as the waveform set is assembled, or may be a preassignment which is stored in appropriate memory. The actual assignment of identifier to waveform is, for the most part, arbitrary. The important point is that if such identifiers are to be used, each waveform shall have associated with it a single, unique identifier. Thus, in general, if the reference waveform set consists of N elements, there will be N unique identifiers, preferably the set $\{0,1,2,\ldots,N-1\}$.

In addition to creation of a continuous analog signal from arbitrary sequences of reference waveforms, distinct uniform time intervals will be distinguished. Many methods exist for accomplishing this including providing a separate physical signal with a known frequency which tracks the continuous analog signal, modulating a relatively high frequency bias signal in a like manner, etc. Another method, dependent on the reference waveforms themselves, is to restrict each reference waveform to always end at a predetermined relative minima, such as the zero point. In this way, a simple zero crossing detector can distinguish the distinct intervals of time, i.e., the distinct reference waveforms. The important criterion is that the continuous analog signal can be partitioned by time intervals, each interval containing a single reference waveform. The entire set of reference waveforms can then be stored in a known pattern over a known set of intervals so that the distinct reference waveforms can be retrieved from the analog signal upon playback. The exact sequence and time interval is not important as long as it can be identified and referenced upon playback. In fact, the set of reference waveforms can be output multiple times if appropriate.

A simple example involves a magnetic disk drive of the type commonly used in personal computers. An entire set of return to zero reference waveforms is stored in an incrementing pattern as a continuous analog waveform stream at the beginning of each track. Next stored is a marker or indicator such as a predetermined blank area. The blank area is followed by a continuous analog data waveform stream formed as discussed further below. The blank area serves to separate the reference values from the data values being stored. By counting the number of zero crossings from the index pulse (which denotes the beginning of a track) to the blank area, it is possible to determine the number of reference waveforms being used, i.e., the number of zero crossings equals the number of reference waveforms. In essence, this example involves the establishing of a standard for each reference waveform for that track. The set of such standard reference waveforms is referred to hereafter as the standard reference waveform set. Since, as discussed further below, the geometries of the tracks vary as a function of their location on the diameter of the disk, the standard reference waveform set may only be pertinent for that particular track.

The goal is to store and retrieve an arbitrary digital data stream. To accomplish this, the arbitrary digital data stream is converted to a representation in the number system with base N, thus corresponding to the set of identifiers. To simplify implementation of the conversion from the arbitrary digital data stream to the sequence of waveform identifiers, N is chosen to be a power of 2, such as 16. Hexadecimal identifiers may then be used, and the conversion process is to simply bit serialize the arbitrary digital data stream, group the resulting values into nibbles (sets of four bits) and assign the appropriate hexadecimal identifier to each nibble. The reference waveform corresponding to each identifier is then retrieved, and a set of the waveforms assembled in the order of the data, which set is hereafter referred to as the data waveform set. The data waveform set represents the arbitrary digital data stream. The data waveform set may then be stored on the magnetic media by means well known in the art.

The retrieving of the data is performed by reading the analog signal by means well known in the art and separating it into the individual waveforms. The continuous data and standard reference waveforms are separated into distinct intervals. Distinguishing between the data and standard reference waveform sections of the continuous analog signal is facilitated by the above described marker or indicator. Once separated, the standard reference waveform set may be partitioned. The data waveform set may be similarly partitioned to arrive at distinct data waveforms. The partitioned standard reference waveform set is then used as a "key" to identify each individual data waveform, although as discussed above, this "key" may only be relevant to the track on which it is stored. Since the reference values were stored in known locations, they can be retrieved and associated with the proper identifier. By comparison of the data waveforms with the standard reference waveforms for that track, the data waveforms may be assigned the proper identifier. The identifier may then be used to assign each data waveform its corresponding digital value.

It is not necessary that the retrieved reference values match the original waveforms. The retrieved waveforms are likely to be distorted during the storage and retrieval process. What is important, however, is that there be a correspondence in the distortion between the reference waveforms and the data waveforms, especially insofar as distortion due to varying geometries is concerned. For example, the magnetic media upon which the standard reference waveforms and data waveforms are stored will be divided into areas which are grouped together locally. For example, a disk drive will group locally into concentric tracks, each with a slightly different distortion due to its relative location on the disk. This distortion is due to the fact that as the disk rotates at a constant speed, the linear speed at a specific track is proportional to the radius from the center of the disk. The relative correlation of distortion is employed when the waveforms which represent the arbitrary data stream are retrieved and compared with the standard reference waveforms for that track. By comparing the data waveforms with the standard reference waveforms, a most probable reference waveform representing each of the data waveforms may be arrived at. The determination of the closest fit between a data waveform and one element of the standard reference waveform set may be accomplished in many ways including point-by-point comparison, slope-fit or area fit routines, etc.

The final conversion to the digital data stream is simply the inverse process of the original encoding. For example, if hexadecimal identifiers are used, each retrieved waveform is correlated by the apparatus into one of sixteen identifiers, which are then converted by the apparatus into the appropriate nibble.

Thus, the above described method automatically compensates for geometric distortions and circuit limitations by using the most relevant retrieved reference values—those reference values subject to identical limitations upon storage and retrieval as the data. By determining the most probable match, errors such as d/a and a/d conversion errors are accounted for. The limits to the amount of data which can be encoded is determined by the specific media and circuit embodiment.

An important benefit of the present invention is the ability to assign an arbitrary amount of data to each data waveform. That is, in the general case discussed above, if N is the number of reference waveforms, the largest word which could be represented by one of the reference waveforms was an n-bit word, where $N = 2^n$. If a number of the bits, say m, are of constant value over a predetermined time interval, then each reference waveform may represent $n+m$ bits in that time interval. By combining the continuous waveform data storage method with knowledge about the bit-time dependence, significant data storage compression may be achieved. Other indicators than time may be used, however, as a measure of bit-variation in appropriate applications.

Importantly, the storage of signals is by way of analog waveforms. These waveforms can represent arbitrary amounts of data. Correction for storage and retrieval errors is facilitated by the storage of standard reference waveforms. The analog waveforms may represent digital data. The digital data will be input and output to the system according to the present invention. Thus, standard digital signal processing techniques well known in the art may be used to detect and correct errors at that stage.

2. Specific Embodiments

Figure 2:
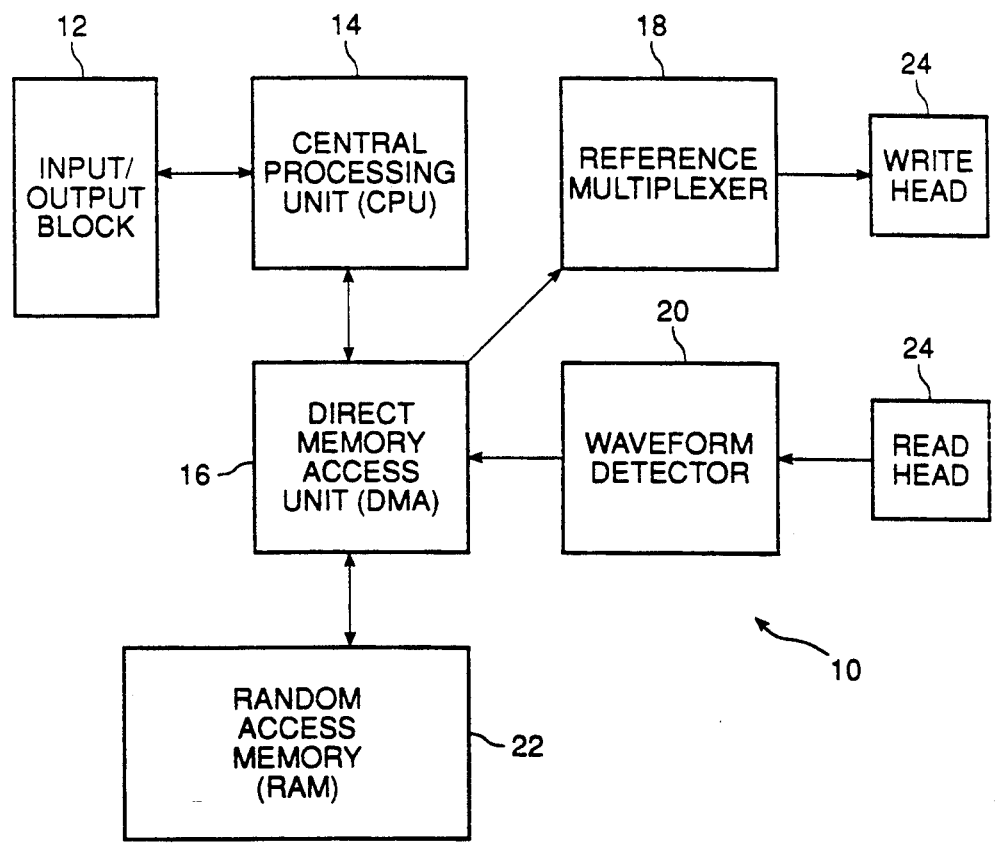
Fig. 2 shows a block diagram of a storage and retrieval apparatus according to one embodiment of the present invention.

A block diagram of a storage and retrieval apparatus 10 according to the present invention is shown in FIG. 2. It consists of an input/output block 12 connected to a central processing unit (CPU) 14, which is in turn connected to a direct memory access (DMA) unit 16. Also connected to DMA 16 are reference multiplexer 18, waveform detector 20 and a random access memory (RAM) 22. Reference multiplexer 18 is connected to write head assembly 24. Waveform detector 20 is connected to read head assembly 26. A media transport system (not shown) may be employed, controlled by a controller (also not shown), where appropriate.

CPU 14 coordinates the actions of the DMA 16, the reference multiplexer 18 and the waveform detector 20. Arbitrary digital data streams originate from the input/output block 12. CPU 14 places the arbitrary data in RAM 22 in the appropriate locations. The arbitrary data is preceded by each possible reference value, preferably the 16 values 0 through F of the hexadecimal counting system, in an incrementing sequence for the reference waveforms. When a write out to the storage media is called for, CPU 14 initializes DMA 16 for output to the reference multiplexer 18 which in turn transmits the data to write head 24. When a start pulse is detected (for example, from the storage media or controller) the data waveforms in RAM 22 are output to reference multiplexer 18, and converted into a continuous analog output signal composed of the 16 different reference waveforms. The process for this conversion is described further below with regard to the description of reference multiplexer 18. This analog signal modulates the magnetic write head 24 to place an analog signal onto the magnetic media.

During retrieval of the data, CPU 14 initializes DMA 16 to transfer data from waveform detector 20 into RAM 22. The data is retrieved from the magnetic media via read head 26 which transmits the data to waveform detector 20, which in turn transmits the data to RAM 22. Waveform detector 20 synchronizes to a zero crossing and samples the waveform, thereby partitioning the continuous analog signal into individual data waveforms. When the data has been transferred, CPU 14 controls the retrieval of data from RAM 22 to be delivered to input/output block 12. Correlation computation is then performed on the data waveforms as discussed in detail above. The data stream is then sent to an input/output point (not shown) of input/output block 12. This data transfer may be accomplished by reading the RAM and writing to the input/output port, as is well known in the art. This task may also be done by DMA 16 if the data is stored in a contiguous area of RAM 22.

Figure 3A:
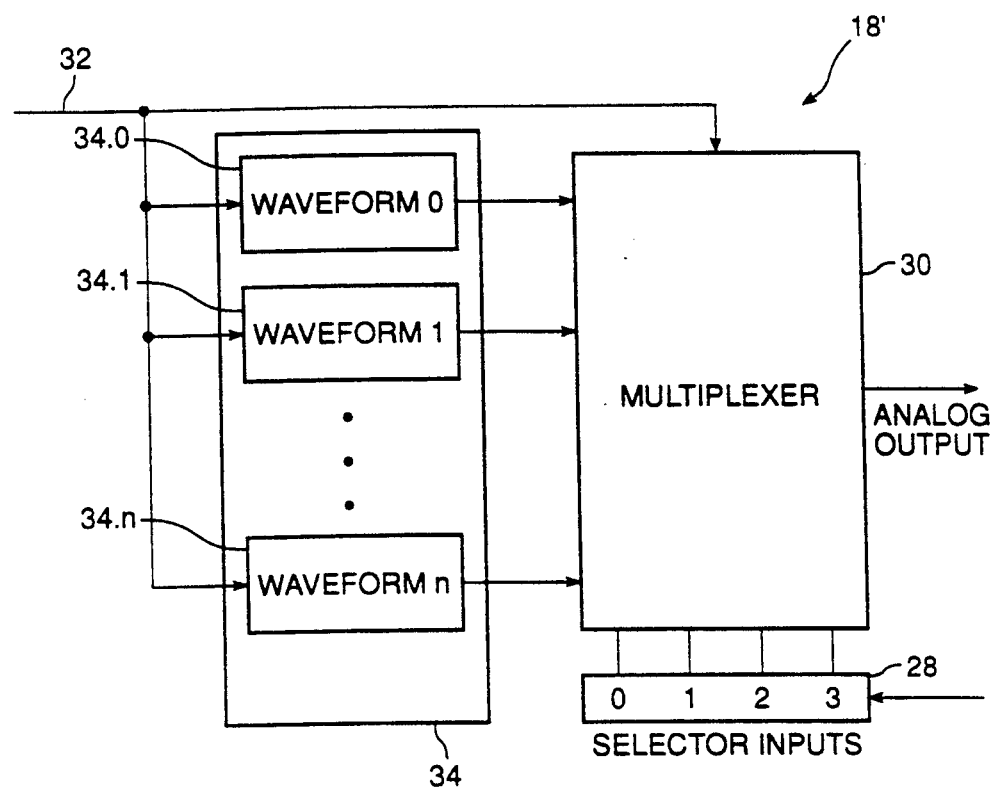
FIG. 3A shows a block diagram of a reference multiplexer according to one embodiment of the present invention.

FIG. 3A illustrates one embodiment 18' of the reference multiplexer 18 of FIG. 2. The function of the reference multiplexer 18' is to produce the appropriate analog signal as an output based on a given input. The input is an element of the identifier set, preferably one of 16 digital values. In order to arrive at 16 identifier values, four selector inputs designated 0, 1, 2 and 3, are required to a selector circuit 28. There are no restrictions on the number of selector inputs except that there be a sufficient number capable of representing the entire identifier set. The waveforms selected are output at an analog output stage of multiplexer 30. A strobe input 32 initiates a waveform to be output based on the selector inputs. Each waveform will be formed by waveform source block 34. Waveform source block 34 preferably includes waveform generating circuits 34.0, 34.1, ..., 34.n. When hexadecimal identifiers are used, n will be 15. Each of waveform generating circuit 34.0 through 34.n are synchronizable circuits which are capable of generating a unique waveform which in turn may be multiplexed onto the analog output.

Figure 3B:
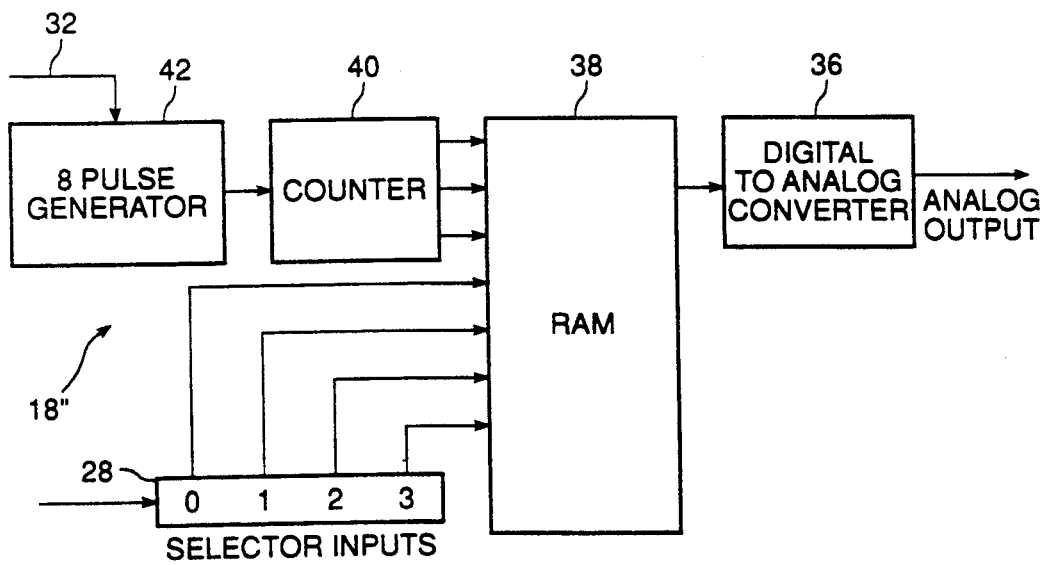
FIG. 3B shows a block diagram of a digital-to-analog converter-based reference multiplexer according to another embodiment of the present invention.

FIG. 3B illustrates a d/a converter-based reference multiplexer 18". The input and output signals are similar to that described above with regard to reference multiplexer 18' of FIG. 3A. The distinguishing feature of reference multiplexer 18" is that the analog output is created by a d/a converter 36 which receives input data from RAM 38 which contains digital representations of each of the waveforms. Counter 40 produces the pulses for timing discrete descriptions of the waveforms. That is, counter 40 produces count signals used to control the output of RAM 38 to d/a converter 36. The counter is incremented by a pulse generator 42 which is started upon receipt of the strobe signal 32. Pulse generator 42 generates a set number of pulses used both in storage and retrieval of the analog signals and its synchronization by way of the strobe signal is of significant importance to input and output. The number of pulses generated per time period is relatively arbitrary; the more pulses used, the greater the resolution of waveforms is possible. Eight pulses is, however, a preferred number.

Figure 4:
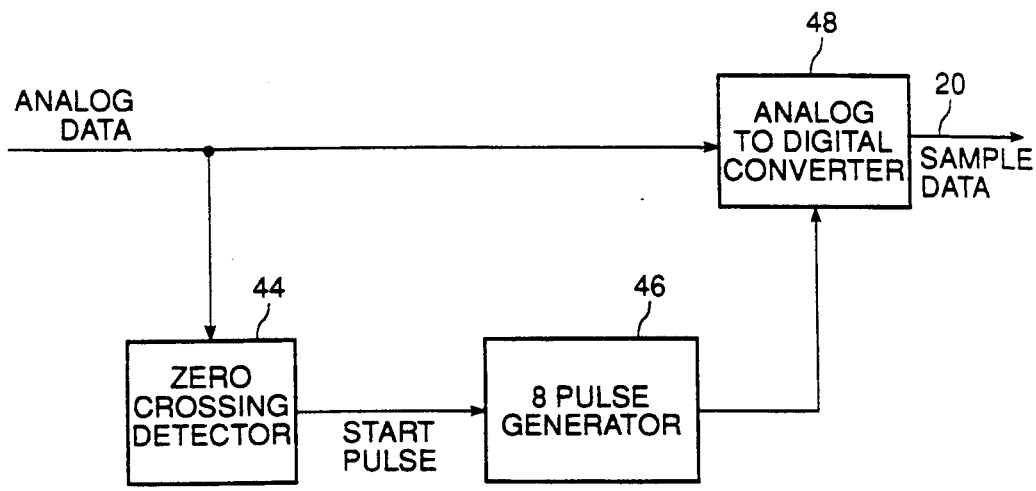
FIG. 4 shows a block diagram of a waveform detector according to one embodiment of the present invention.

FIG. 4 illustrates in detail waveform detector 20 of FIG. 2. The function of waveform detector 20 is to produce a number of digital samples, corresponding to the number used by pulse generator 42 (FIG. 3B), or a predetermined number based on desired resolution, starting from zero crossing for each waveform. A waveform's start is detected by zero crossing detector 44, whose input is the analog data signal. Detection of a zero crossing starts the pulse generator 46 whose output is the sample strobe signal. The sample strobe signal is introduced to a/d converter 48. Also introduced to a/d converter 48 is the analog data signal. A/d converter uses the sample strobe signal to produce synchronized sample data from the analog data input signal. The output signal of a/d converter 48 is introduced to DMA 16 (FIG. 2).

Figure 5:
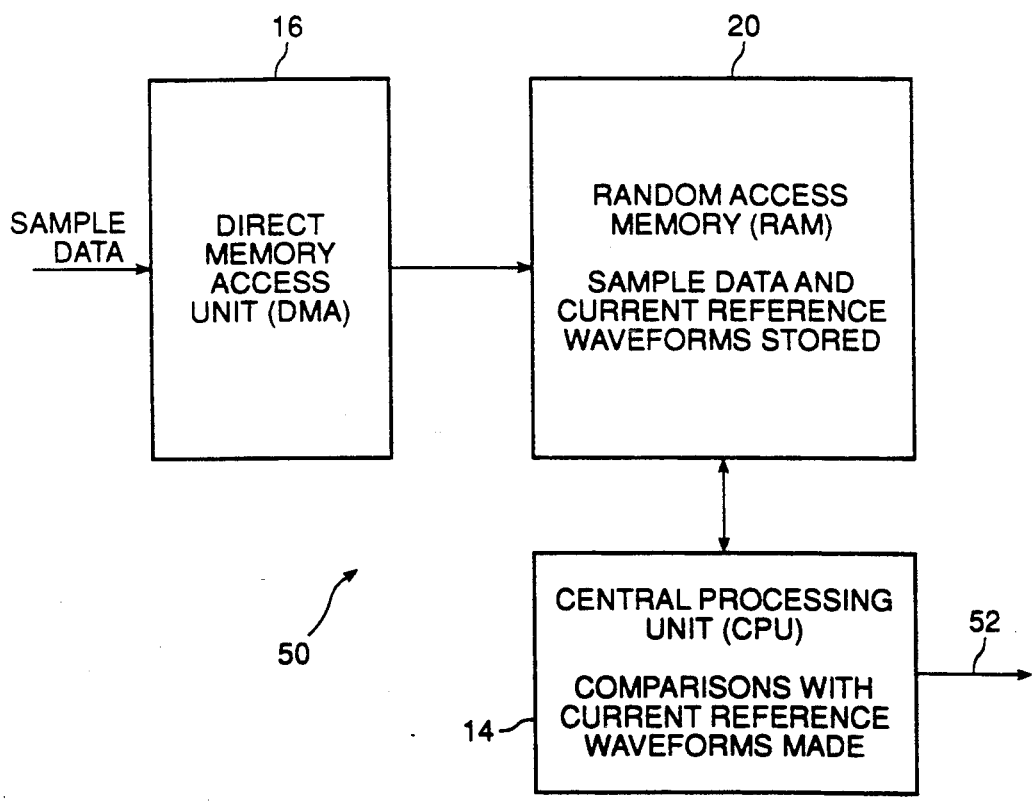
FIG. 5 shows a block diagram of a reference decoder according to one embodiment of the present invention.

FIG. 5 illustrates the interactions of CPU 14, DMA 16 and RAM 20 of FIG. 2, collectively referred to for the present description as reference decoder 50. Reference decoder 50 functions to set the standard reference waveforms or to compare a data waveform with the set of standard reference waveforms and to compute the most probable data value corresponding to the data waveform. The sample data output signal from a/d converter 48 (FIG. 4) are introduced into RAM 20. When the entire set of waveforms are input into RAM 20, CPU 14 scans through RAM 20 to set the current standard reference waveforms then computes the closest match by calculating sums of distances, one for each standard reference waveform. The sums of distances are calculated by subtracting the corresponding sample data from the appropriate sample of the standard reference waveform. The absolute value of the difference is added to the sum. When all sums are calculated the smallest is declared to be the closest match. This is converted into the appropriate hexadecimal nibble by, for example, CPU 14 and is output to the data outputs along the data output line 52.

Although many elements of the present invention have been described as distinct and separate, being connected to accomplish operation of the present invention, many characteristics of the invention may be improved, for example speed and accuracy, by providing each of the blocks as dedicated hardware. Additionally, the above described relative minimum function can also be implemented in hardware to produce a real time stream of data outputs. In general, to those skilled in the art to which this invention relates, many changes in construction in widely differing embodiments and applications of the present invention will suggest themselves without departing from its spirit and scope. Thus, the disclosures and descriptions herein are purely illustrative, and are not intended to be in any sense limiting.

What is claimed is:

1. A method for retrieving an arbitrary ordered digital data stream from a magnetic media, the arbitrary ordered digital data stream being uniquely represented by an ordered analog data waveform set made up of elements of analog reference waveform set stored on the magnetic media, comprising the steps of:
   retrieving the set of analog reference waveforms from the magnetic media;
   establishing a correspondence between the retrieved set of analog reference waveforms and the digital data;
   retrieving the ordered set of analog data waveforms;
   establishing correspondence between each retrieved analog data waveform and the analog reference waveforms; and
   forming an ordered stream of digital data by comparing the retrieved ordered set of analog data waveforms to the retrieved set of reference data waveforms representing known assigned digital values.

2. The method of claim 1, wherein said reference waveforms are distinguished from said data waveforms by the location on the magnetic media of a marker signal.

3. The method of claim 1, wherein correspondence is a statistical correspondence.

4. The method of claim 1, further comprising the steps of establishing distinct time intervals and separating the elements of the set of analog data waveforms from one another based on said distinct time intervals.

5. The method of claim 4, wherein said step of establishing distinct time intervals is accomplished by determining the time at which said analog data waveforms assume a predetermined value.

6. A method for storing an arbitrary ordered digital data stream on a magnetic media, and retrieving same, comprising the steps of:

forming a set of analog reference waveforms;

assigning each analog reference waveform to a unique value of the digital data comprising the arbitrary ordered digital data stream;

ordering the analog reference waveforms into a set of analog data waveforms to correspond to the order of the arbitrary ordered digital data stream;

storing the set of ordered analog data waveforms on the magnetic media;

storing the set of analog reference waveforms on the magnetic media;

retrieving the set of analog reference waveforms from the magnetic media;

establishing the correspondence between the retrieved set of analog reference waveforms and the digital data;

retrieving the ordered set of analog data waveforms;

establishing correspondence between each retrieved analog data waveform and the analog reference waveforms;

forming an ordered stream of digital data by comparing the retrieved ordered set of analog data waveforms to the retrieved set of reference data waveforms representing known assigned digital values.

7. The method of claim 6, further comprising the steps of producing a marker signal, storing said marker signal in interposition between said data waveforms and said reference waveforms on the magnetic media, and distinguishing said reference waveforms from said data waveforms upon retrieval by the location on the magnetic media of said marker signal.

8. The method of claim 7, wherein the elements of said set of analog reference waveforms are predetermined and stored in memory and further wherein the step of forming the set of analog reference waveforms consists of retrieving said elements from said memory.

9. The method of claim 8, further comprising the steps of establishing distinct time intervals and separating the elements of the set of analog data waveforms from one another based on said distinct time intervals.

10. The method of claim 9, wherein said step of establishing distinct time intervals is accomplished by determining the time at which said analog data waveforms assume a predetermined value.

11. A method for storing an arbitrary ordered digital data stream on a magnetic media, and retrieving same, comprising the steps of:

forming a set of analog reference waveforms;

assigning a unique identifier to each of said reference waveforms;

converting the ordered digital data stream to be stored into an ordered stream of identifiers;

forming from said set of analog reference waveforms an ordered stream of analog data waveforms corresponding to the ordered stream of identifiers;

storing the ordered stream of analog data waveforms on the magnetic media;

storing the set of analog reference waveforms on the magnetic media;

retrieving the set of analog reference waveforms from the magnetic media;

determining which identifier has been assigned to each retrieved analog reference waveform;

retrieving the ordered stream of analog data waveforms;

establishing correspondence between each retrieved analog data waveform and the analog reference waveforms;

forming an ordered stream of identifiers corresponding to the retrieved ordered stream of analog data waveforms; and converting the ordered stream of identifiers corresponding to the retrieved ordered stream of analog data waveforms into a corresponding stream of digital data.

12. The method of claim 11, wherein the elements of said ordered stream of identifiers are elements of the number system whose base is a power of 2.

13. The method of claim 15, wherein the number system is base 16.

14. The method of claim 12, further comprising the steps of producing a marker signal, storing said marker signal in interposition between said data waveforms and said reference waveforms on the magnetic media, and distinguishing said reference waveforms from said data waveforms upon retrieval by the location on the magnetic media of said marker signal.

15. The method of claim 14, wherein the elements of said set of analog reference waveforms are predetermined and stored in memory and further wherein the step of forming the set of analog reference waveforms consists of retrieving said elements from said memory.

16. The method of claim 15, further comprising the steps of establishing distinct time intervals and separating the elements of the set of analog data waveforms from one another based on said distinct time intervals.

17. The method of claim 16, wherein said step of establishing distinct time intervals is accomplished by determining the time at which said analog data waveforms assume a predetermined value.

* * * * *